United States Patent
Bennett et al.

(10) Patent No.: US 8,253,471 B2
(45) Date of Patent: Aug. 28, 2012

(54) HIGH IMPEDANCE BIAS NETWORK

(75) Inventors: Christopher Bennett, Topsham, ME (US); Hrvoje Jasa, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 143 days.

(21) Appl. No.: 12/899,296

(22) Filed: Oct. 6, 2010

(65) Prior Publication Data

US 2011/0084759 A1 Apr. 14, 2011

Related U.S. Application Data

(60) Provisional application No. 61/250,383, filed on Oct. 9, 2009.

(51) Int. Cl.
*H03K 5/08* (2006.01)

(52) U.S. Cl. ........ 327/320; 327/317; 327/325; 327/505; 327/565; 327/583

(58) Field of Classification Search .................. 327/309, 327/317, 318, 320, 325, 493, 503–505, 565, 327/566, 583
See application file for complete search history.

(56) References Cited

U.S. PATENT DOCUMENTS

| | | | | |
|---|---|---|---|---|
| 3,754,193 | A | * | 8/1973 | Reinhard ...................... 330/261 |
| 4,158,863 | A | * | 6/1979 | Naylor ............................ 361/56 |
| 4,321,485 | A | * | 3/1982 | Morozowich et al. ........ 327/478 |
| 6,025,746 | A | * | 2/2000 | So ................................. 327/325 |
| 6,426,665 | B2 | * | 7/2002 | Morishita .................... 327/310 |
| 6,453,048 | B1 | * | 9/2002 | Akino ........................... 381/113 |
| 7,018,095 | B2 | * | 3/2006 | Grannes et al. ............... 374/166 |
| 7,110,560 | B2 | * | 9/2006 | Stenberg ....................... 381/113 |
| 7,911,236 | B2 | * | 3/2011 | Asam .............................. 327/58 |
| 2004/0066942 | A1 | * | 4/2004 | Bank et al. .................... 381/116 |
| 2006/0132996 | A1 | * | 6/2006 | Poulton ........................... 361/56 |
| 2012/0056668 | A1 | * | 3/2012 | Jordan et al. ................. 327/566 |
| 2012/0056671 | A1 | * | 3/2012 | Jordan et al. ................. 330/252 |

* cited by examiner

*Primary Examiner* — Lincoln Donovan
*Assistant Examiner* — William Hernandez
(74) *Attorney, Agent, or Firm* — Schwegman, Lundberg & Woessner, P.A.

(57) ABSTRACT

This document discusses, among other things, a system and method for offsetting reverse-bias leakage of a high impedance bias network. In an example, an apparatus includes an anti-parallel diode pair coupled between a signal node and a common-mode node. The anti-parallel diode pair can include a first diode and a second diode coupled to the first diode. A third diode can be coupled between a supply node and the signal node, and the third diode can be sized to compensate for a parasitic diode junction of the anti-parallel diode pair.

20 Claims, 4 Drawing Sheets

HIGH IMPEDANCE BIAS NETWORK

CLAIM OF PRIORITY

The present application claims benefit of priority under 35 U.S.C. 119(e) of Bennett et al. U.S. Provisional Patent Application Ser. No. 61/250,383, entitled "HIGH IMPEDANCE INPUT FOR A MICROPHONE," filed on Oct. 9, 2009, which is hereby incorporated by reference herein in its entirety.

BACKGROUND

High impedance networks allow signals to be biased before being processed. Biasing may be desired to allow a subsequent circuit to receive the extreme limits of the signal, to process the entire range of the signal, allow the signal to be referenced to a particular level or combinations thereof. Another goal of biasing a signal is to avoid distortion of the signal with a biasing network.

OVERVIEW

This document discusses, among other things, methods and apparatus for an integrated circuit, high impedance bias network using a very small integrated circuit area. In an example, an apparatus can include first, second, and third diodes configured to form a high impedance bias network. In an example, the third diode can be sized to compensate for a parasitic diode junction of an anti-parallel diode pair formed by the first and second diodes.

In Example 1, an apparatus includes an anti-parallel diode pair coupled between a signal node and a common-mode node. The anti-parallel diode pair can include a first diode and a second diode coupled to the first diode. The apparatus can further include a third diode coupled between a supply node and the signal node, the third diode sized to compensate for a parasitic diode junction of the anti-parallel diode pair.

In Example 2, the parasitic diode junction of Example 1 is optionally coupled to the signal node.

In Example 3, an anode of the parasitic diode junction of any one or more of Examples 1-2 is optionally coupled to a reference node.

In Example 4, any one or more of Examples 1-3 optionally includes an integrated circuit including the anti-parallel diode pair and the third diode.

In Example 5, the first diode of any one or more of Examples 1-4 optionally includes a P+ diode.

In Example 6, the second diode of any one or more of Examples 1-5 optionally includes a P+ diode.

In Example 7, the first diode of any one or more of Examples 1-6 optionally includes a portion of a first bipolar transistor.

In Example 8, the second diode of any one or more of Examples 1-7 optionally includes a portion of a second bipolar transistor.

In Example 9, a method includes receiving a signal at a signal node of an anti-parallel diode pair, receiving an offset voltage at a common-mode node of the anti-parallel diode pair, and providing a compensation current through a third diode coupled to the signal node, the compensation current configured to offset a leakage current of a parasitic diode junction of the anti parallel diode pair.

In Example 10, the receiving the signal of any one or more of Examples 1-9 optionally includes receiving the signal at the parasitic diode junction.

In Example 11, the receiving the signal of any one or more of Examples 1-10 optionally includes receiving the signal at an anode of the parasitic diode junction coupled the signal node.

In Example 12, the receiving the signal of any one or more of Examples 1-11 optionally includes receiving the signal at an anode of a first diode of the anti-parallel diode pair.

In Example 13, the receiving the offset voltage of any one or more of Examples 1-12 optionally includes receiving the offset voltage at an anode of a second diode of the anti-parallel diode pair.

In Example 14, the receiving the signal at the signal node of the anti-parallel diode pair of any one or more of Example 1-13 optionally includes receiving the signal at a base node of a first transistor.

In Example 15, the receiving the offset voltage at the common-mode node of the anti-parallel diode pair of any one or more of Example 1-14 optionally includes receiving the offset voltage at an emitter of a second transistor.

In Example 16, the providing the compensation current through the third diode coupled to the signal node of any one or more of Example 1-15 optionally includes receiving a supply voltage at a base node of a transistor including the third diode.

In Example 17, a system includes a microphone configured to generate a signal corresponding to received, ambient sound, and an integrated circuit configured to receive the signal at a signal node, to receive a common-mode voltage at a common-mode node, and to offset the signal by the common-mode voltage. The integrated circuit optionally includes an anti-parallel diode pair coupled between the signal node and the common-mode node. The anti-parallel diode pair optionally includes a first diode and a second diode coupled to the first diode. The integrated circuit optionally includes a third diode coupled between a supply node and the signal node, the third diode sized to compensate for a parasitic diode junction of the anti-parallel diode pair.

In Example 18, the first diode of any one or more of Example 1-17 optionally includes a portion of a first transistor and the second diode includes a portion of a second transistor.

In Example 19, the third diode of any one or more of Example 1-18 optionally includes a portion of a third transistor.

In Example 20, an N-well of the third transistor of any one or more of Example 1-19 is optionally sized to compensate for a parasitic diode junction of the anti-parallel diode pair.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by the machine, cause the machine to perform any one or more of the functions of Examples 1-20.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, an integrated circuit, high impedance input bias network method and structure capable of providing one or more of extremely high impedance, minimal impedance variation over a range of input voltages, symmetric impedance about common mode voltage, low capacitance, or minimal integrated circuit area requirements.

Figure 1:
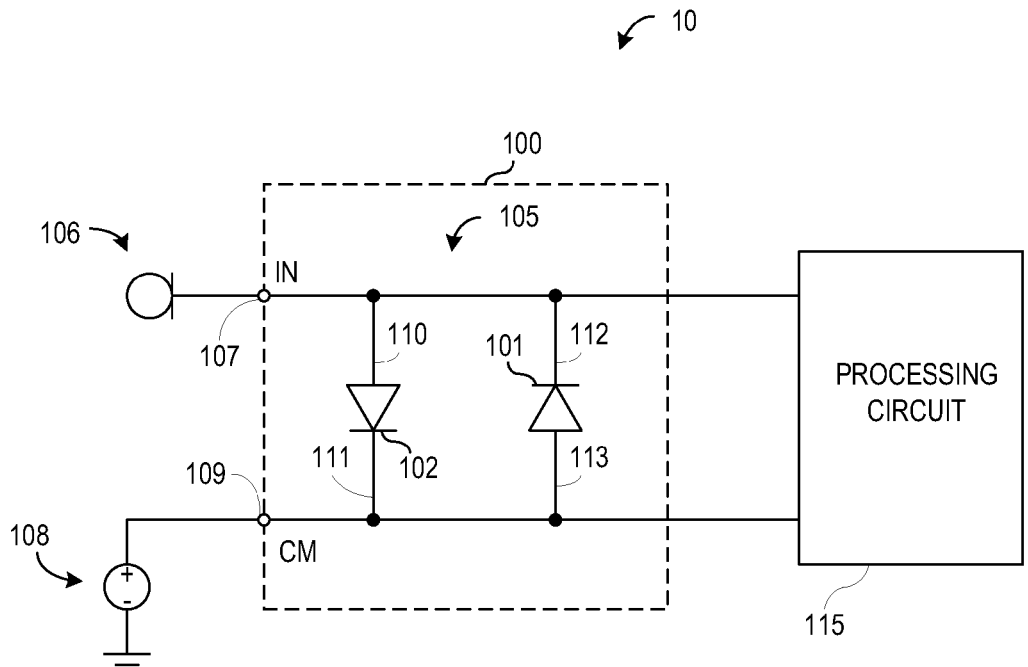
FIG. 1 illustrates generally an example of a system including a bias network having an anti-parallel diode pair.

FIG. 1 illustrates generally an example of a system 10 including an audio input transducer 106, a bias network 100, and a processing circuit 115. The bias network 100 includes an anti-parallel diode pair 105. In an example, the anti-parallel diode pair 105 can include a first diode 101 and a second diode 102. In the example of FIG. 1, an anode 110 of the second diode 102 is coupled to a cathode 112 of the first diode 101 and a cathode 111 of the second diode 102 is coupled the anode 113 of the first diode 101 to form the anti-parallel diode pair 105. The bias network 100 can provide very high impedance and can be used to bias an input signal to the system 10, such as an input audio signal from a microphone 106. The input signal can be connected to a first terminal 107 of the bias network 100 and a common mode voltage 108 can be connected to a second terminal 109 of the bias network 100, for example, to bias the input signal 106.

Figure 2:
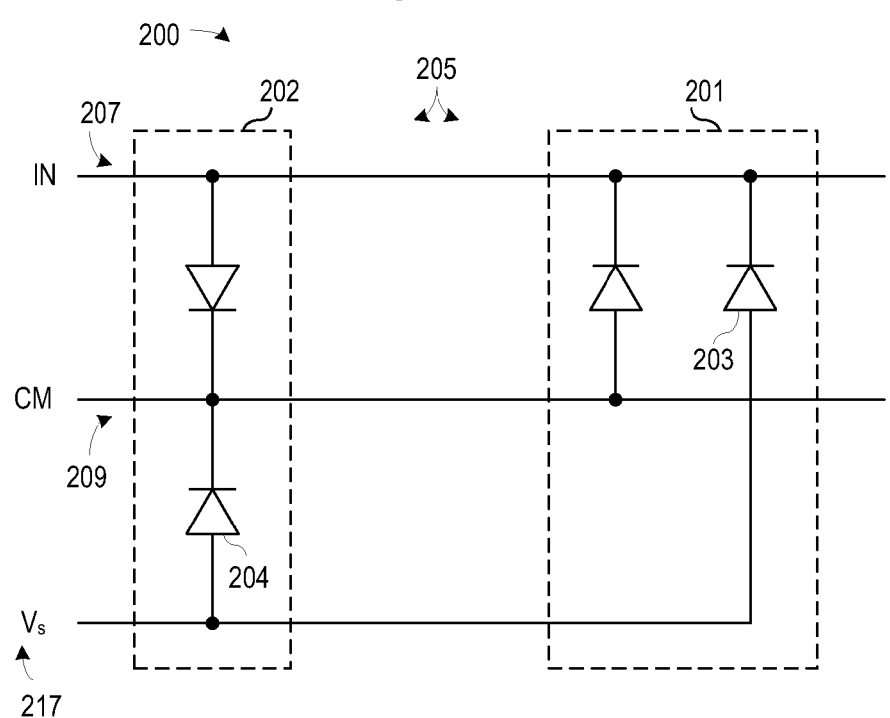
FIG. 2 illustrates generally an example of a bias network including an anti-parallel diode pair.

FIG. 2 illustrates generally an example of a bias network 200 including an anti-parallel diode pair 205, for example, implemented in an integrated circuit. The bias network 200 can include parasitic diode junctions 203, 204 formed as result of the implementation of the first and second diodes 201, 202 of the anti-parallel diode pair 205. The first and second diodes 201, 202 can include a first parasitic diode junction 203 and a second parasitic diode junction 204. The first and second parasitic diode junctions 203, 204 can be formed between a semiconductor portion of the first and second diodes 201, 202 and a semiconductor substrate. When implemented as a high impedance network, a signal can be received at a first node 207 of the anti-parallel diode pair 205, and a common mode (CM) voltage can be received at a second node 209 of the anti-parallel diode pair 205. As the input signal varies, the first parasitic diode 203 can become reversed bias and leakage current can flow between the first node 207 of the anti-parallel diode pair 205 and a reference potential 217 coupled to the cathode of the first parasitic diode junction 203. Leakage current of the first parasitic diode junction 203 sourced or sunk by the first node 207 of the anti-parallel diode pair 205 can distort the received signal. For example, if a positive common mode voltage is applied at the second node 209, an ideal bias network should have zero current flow at the input node 207 when the input node 207 is at the common-mode voltage. However, due to leakage current through the first parasitic diode junction 203 coupled to the first node 207 of the bias network 200, the value of the input voltage at which no current flows at the first node 207 of the anti-parallel diode pair 205 can be something other than the common mode voltage. The reverse bias leakage current of the first parasitic diode junction 203 can contribute to total harmonic distortion of the input signal.

Figure 3:
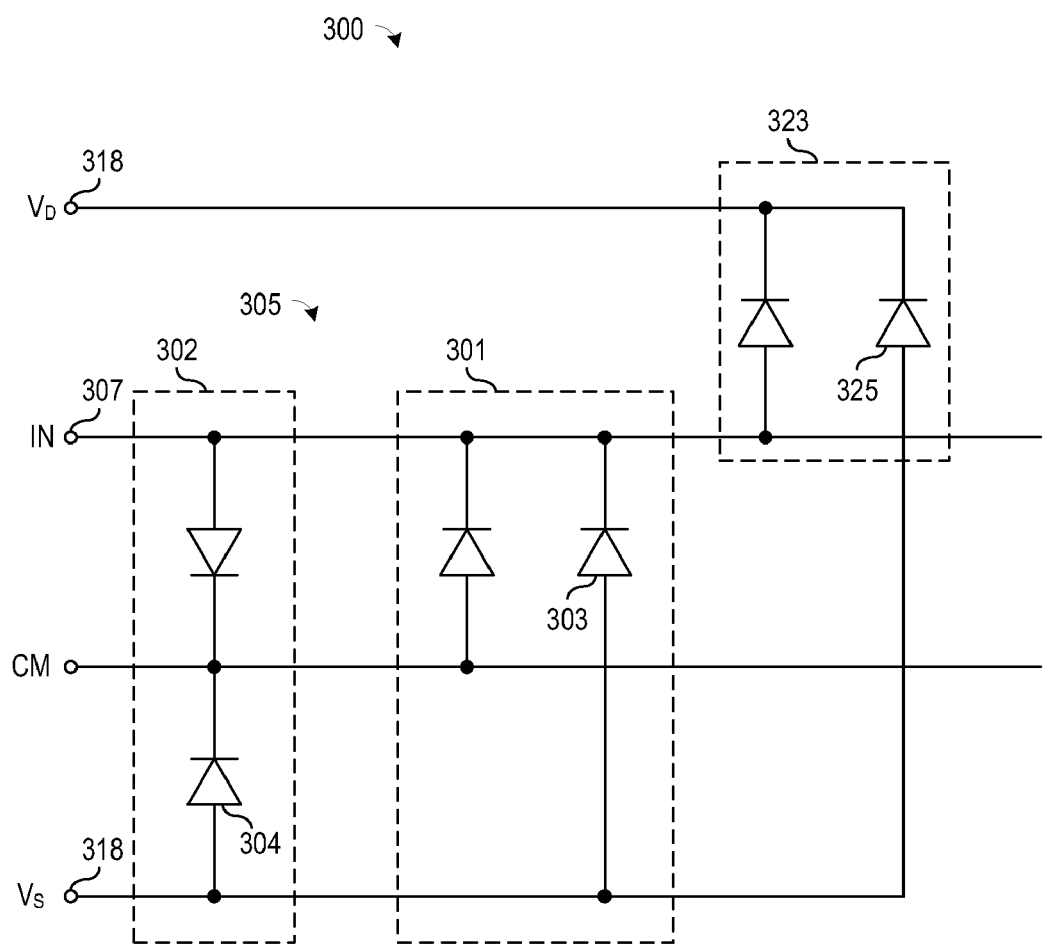
FIG. 3 illustrates generally an example of an integrated, anti-parallel diode pair.

FIG. 3 illustrates generally an example of a high impedance bias network 300 including an integrated, anti-parallel diode pair 305 according to an example of the present subject matter. The high impedance bias network 300 can include a first diode 301, a second diode 302, and a third diode 323. Each of the first, second, and third diodes 301, 302, 323 include a parasitic diode junction 303, 304, 325. The first and second diodes 301, 302 are coupled to form an anti-parallel diode pair 305. The first and second parasitic diode junctions 303, 304 can result from the formation of the first and second diodes 301, 302 within an integrated circuit. As discussed above, in an example, a parasitic diode junction of one of the first and second diodes 301, 302 can be coupled to an input node 307. When reversed bias, the parasitic diode junction 303 can distort an input signal via leakage current flowing between the input node 307 and a reference node 318 through the parasitic diode junction 303. In certain high impedance bias network 300 examples, a third diode 323 can be coupled between a supply voltage node 319 and the input node 307. The third diode 323 can provide compensation current to offset the reverse bias leakage current of the parasitic diode junction 303 coupled to the input node 307 of the bias network.

In an example, one or more of the first, second, or third diodes 301, 302, 323 can include P+ diodes formed on a substrate. In an example, an N-well of the third diode 323 can be sized to precisely compensate for the leakage current of the parasitic diode junction 303 of the first diode 302 coupled to the input node 307 of the bias network 300.

Figure 4:
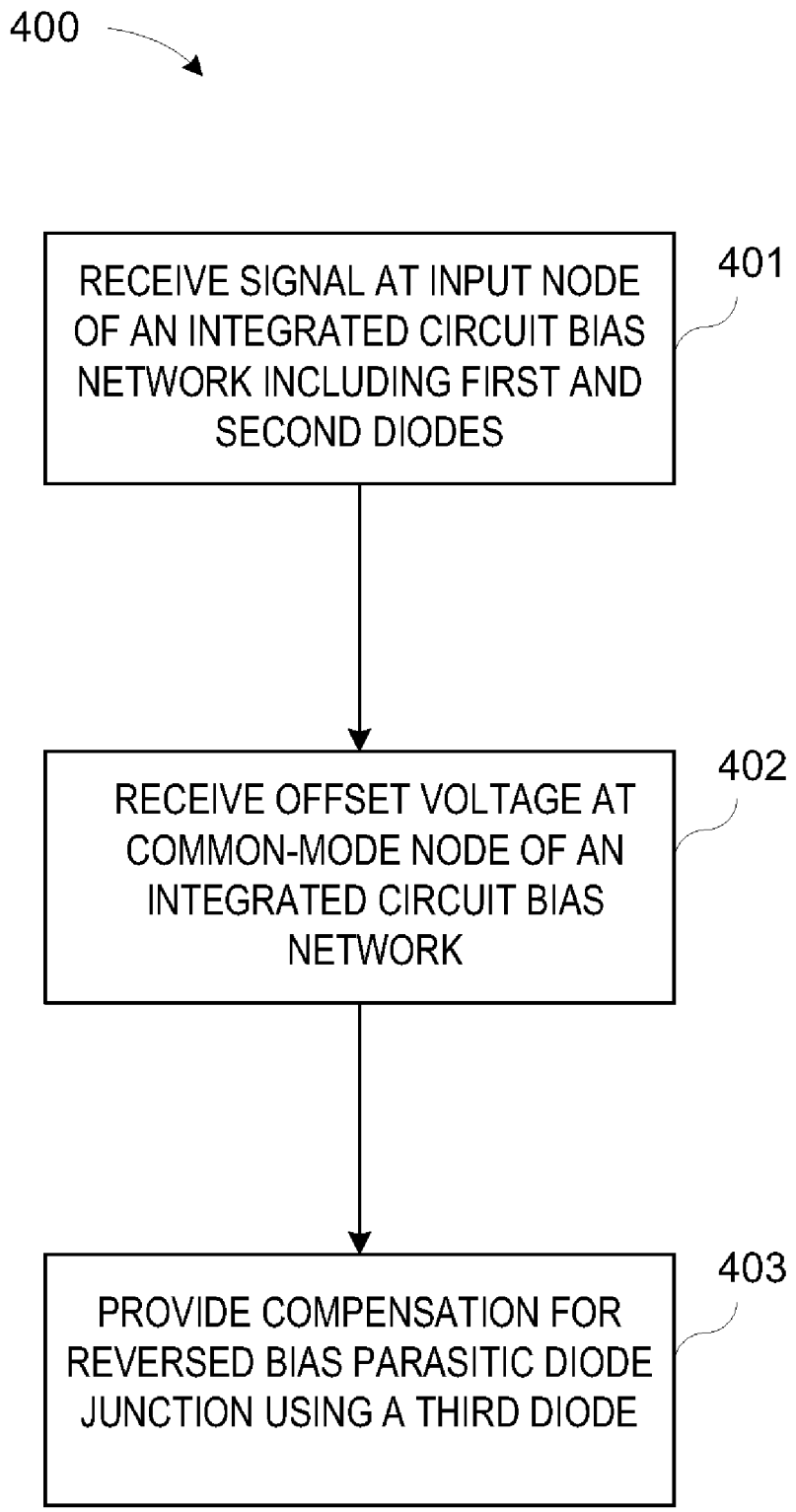
FIG. 4 illustrates an example method of operating a high impedance bias network.

FIG. 4 illustrates generally an example of a method of operating an integrated circuit bias network, such as that illustrated in one or more of FIGS. 1-3.

At 401, a signal can be received at an input node of an integrated circuit bias network including first and second diodes. At 402, an offset voltage can be received at a common-mode node of the integrated circuit bias network. At 403, compensation for a reversed bias parasitic diode junction can be provided using a third diode.

Figure 5:
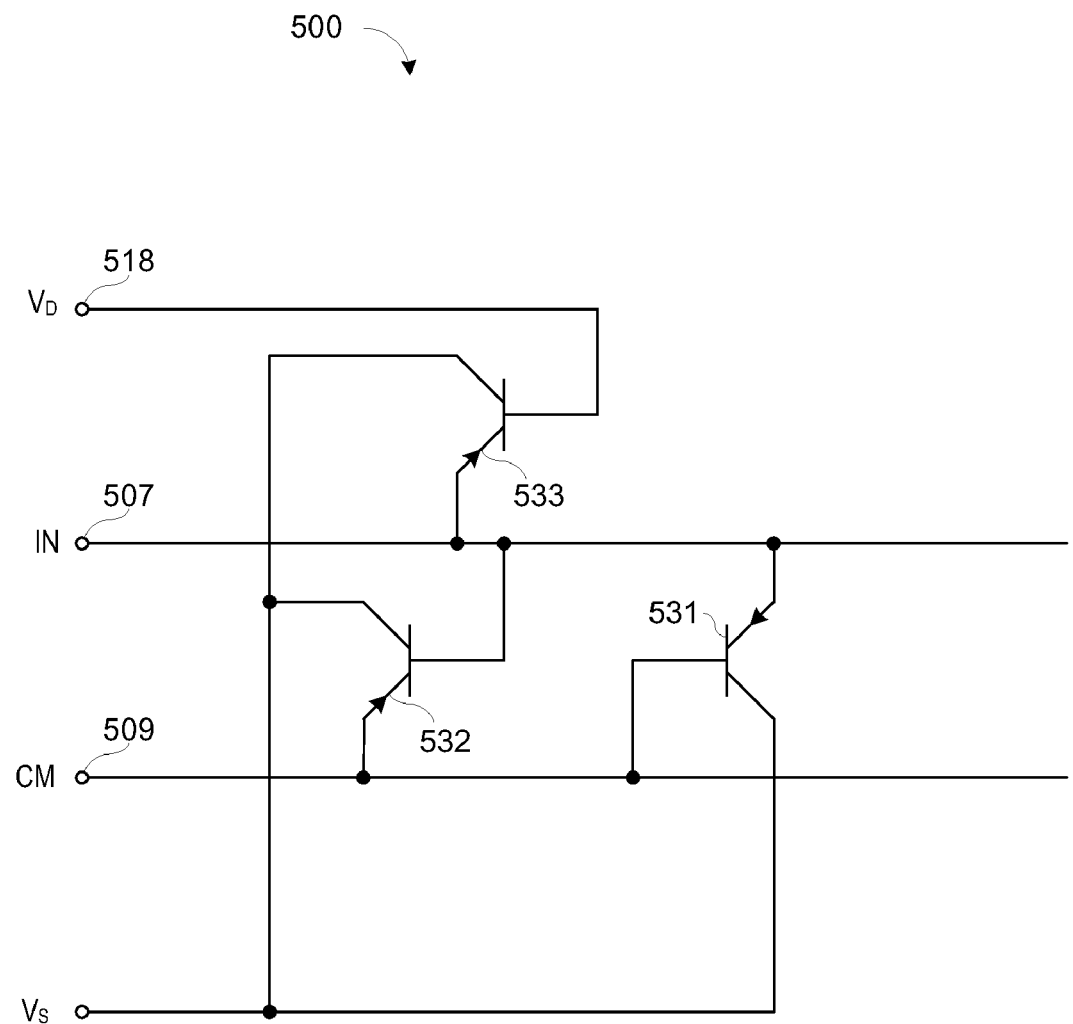
FIG. 5 illustrates generally an example of a high-impedance, integrated circuit bias network.

FIG. 5 illustrates generally an example of a high-impedance, integrated circuit bias network 500 including first, second, and third bipolar transistors 531, 532, 533. The collector-base junction of the first and second transistors 531, 532 can be coupled in an anti-parallel diode configuration. In an example, the collector of the first transistor 531 and the base of the second transistor 532 can be coupled to an input node 507. In an example, the base of the first transistor 531 and the collector of the second transistor 532 can be coupled to a common-mode node 509. In an example, the third transistor 533 can be coupled between the input node 507 and a supply voltage node 518 to provide compensation current to offset reverse bias leakage current of a parasitic diode junction coupled to the signal input 507. The parasitic diode junction can be created during formation of the first and second diodes 531, 532 on a semiconductor substrate. For example, any one or more of the diodes disclosed herein can be formed using a transistor. In other examples, the parasitic diode junctions disclosed herein can be formed between an N-well a transistor and a substrate. In an example, the parasitic diode junction of the example of FIG. 5 can be formed between an N-well of each of the first second and third transistors 531, 532, 533 and a substrate. In the illustrated example of FIG. 5, a parasitic diode junction created between the N-well and substrate of the first diode 301 can leak current when reversed bias by a signal received at the input node 507. A compensation current provided by a reverse bias base-collector junction of the third diode 533 can compensate for the leakage current such that the high-impedance, integrated circuit bias network 500 provides extremely high resistance between the input node 507 and the common-mode node 509 using very little substrate area. Additionally, the bias network 500 does not contribute significantly to total harmonic distortion of a signal received at the input node 507 and biased using an offset voltage received at the common-mode node 509.

Additional Notes

The above detailed description includes references to the accompanying drawings, which form a part of the detailed description. The drawings show, by way of illustration, specific embodiments in which the invention can be practiced. These embodiments are also referred to herein as "examples.". All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although the examples above have been described relating to PNP devices, one or more examples can be applicable to NPN devices. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   an anti-parallel diode pair coupled between a signal node and a common-mode node, the anti-parallel diode pair including:
   a first diode; and
   a second diode coupled to the first diode; and
   a third diode coupled between a supply node and the signal node, the third diode sized to compensate for a parasitic diode junction of the anti-parallel diode pair.

2. The apparatus of claim 1, wherein the parasitic diode junction is coupled to the signal node.

3. The apparatus of claim 2, wherein an anode of the parasitic diode junction is coupled to a reference node.

4. The apparatus of claim 1, including an integrated circuit including the anti-parallel diode pair and the third diode.

5. The apparatus of claim 1, wherein the first diode includes a P+ diode.

6. The apparatus of claim 1, wherein the second diode includes a P+ diode.

7. The apparatus of claim 1, wherein the first diode includes a portion of a first bipolar transistor.

8. The apparatus of claim 1, wherein the second diode includes a portion of a second bipolar transistor.

9. A method comprising:
   receiving a signal at a signal node of an anti-parallel diode pair;
   receiving an offset voltage at a common-mode node of the anti-parallel diode pair; and
   providing a compensation current through a third diode coupled to the signal node, the compensation current configured to offset a leakage current of a parasitic diode junction of the anti parallel diode pair.

10. The method of claim 9, wherein the receiving the signal includes receiving the signal at the parasitic diode junction.

11. The method of claim 10, wherein the receiving the signal includes receiving the signal at an anode of the parasitic diode junction coupled the signal node.

12. The method of claim 9, wherein the receiving the signal includes receiving the signal at an anode of a first diode of the anti-parallel diode pair.

13. The method of claim 12, wherein the receiving the offset voltage includes receiving the offset voltage at an anode of a second diode of the anti-parallel diode pair.

14. The method of claim 9, wherein the receiving the signal at the signal node of the anti-parallel diode pair includes receiving the signal at a base node of a first transistor.

15. The method of claim 14, wherein the receiving the offset voltage at the common-mode node of the anti-parallel diode pair includes receiving the offset voltage at an emitter of a second transistor.

16. The method of claim 9, wherein the providing the compensation current through the third diode coupled to the signal node includes receiving a supply voltage at a base node of a transistor including the third diode.

17. A system comprising:
   a microphone configured to generate a signal corresponding to received ambient sound; and
   an integrated circuit configured to receive the signal at a signal node, to receive a common-mode voltage at a common-mode node, and to offset the signal by the common-mode voltage, the integrated circuit including:

an anti-parallel diode pair coupled between the signal node and the common-mode node, the anti-parallel diode pair including a first diode; and a second diode coupled to the first diode; and a third diode coupled between a supply node and the signal node, the third diode sized to compensate for a parasitic diode junction of the anti-parallel diode pair.

18. The system of claim 17, wherein the first diode includes a portion of a first transistor and the second diode includes a portion of a second transistor.

19. The system of claim 17, wherein the third diode includes a portion of a third transistor.

20. The system of claim 19, wherein an N-well of the third transistor is sized to compensate for a parasitic diode junction of the anti-parallel diode pair.

* * * * *